| (12) | United States Patent | (10) Patent No.: | US 7,847,703 B2 |
|---|---|---|---|
| | Bauschke et al. | (45) Date of Patent: | Dec. 7, 2010 |

(54) UNIVERSAL PROCESS TRANSMITTER CONNECTOR

(75) Inventors: Dirk Bauschke, Shakopee, MN (US); Todd Larson, Shakopee, MN (US); Douglas Wayne Arntson, Maple Grove, MN (US); Nga Doan, Chanhassen, MN (US)

(73) Assignee: Rosemount Inc., Eden Prairie, MN (US)

( * ) Notice: Subject to any disclaimer, the term of this patent is extended or adjusted under 35 U.S.C. 154(b) by 247 days.

(21) Appl. No.: 12/313,226

(22) Filed: Nov. 18, 2008

(65) Prior Publication Data

US 2010/0123591 A1    May 20, 2010

(51) Int. Cl.
 *G08B 21/00*    (2006.01)
(52) U.S. Cl. ............... 340/656; 340/568.2; 340/568.4; 340/635; 340/641; 439/488; 439/490; 439/668
(58) Field of Classification Search ................ 340/656, 340/635, 641, 642, 568.2, 568.4; 362/226, 362/253, 88; 439/488, 489, 490, 551, 668
See application file for complete search history.

(56) References Cited

U.S. PATENT DOCUMENTS

| 3,934,238 | A | * | 1/1976 | Pavlou ...................... 340/611 |
|---|---|---|---|---|
| 5,409,398 | A | | 4/1995 | Chadbourne et al. |
| 5,488,534 | A | | 1/1996 | Rau et al. |
| 5,550,342 | A | | 8/1996 | Danek et al. |
| 5,791,919 | A | * | 8/1998 | Brisson et al. .............. 439/166 |
| 6,163,264 | A | | 12/2000 | Birch et al. |
| 6,526,293 | B1 | | 2/2003 | Matsuo |
| 6,733,333 | B1 | | 5/2004 | Chen |
| 6,734,689 | B1 | * | 5/2004 | Yang .......................... 324/754 |
| 7,239,238 | B2 | | 7/2007 | Tester et al. |
| 7,242,566 | B2 | | 7/2007 | Yegin et al. |
| 7,247,046 | B1 | | 7/2007 | Wu |
| 2005/0099812 | A1 | | 5/2005 | Lee |
| 2006/0265142 | A1 | | 11/2006 | Plishner |
| 2007/0040698 | A1 | | 2/2007 | Hoffmann et al. |
| 2007/0161273 | A1 | | 7/2007 | Staiger |

FOREIGN PATENT DOCUMENTS

| KR | 101995-0002114 A | 1/1995 |
|---|---|---|
| KR | 20-0133107 Y1 | 10/1999 |

OTHER PUBLICATIONS

Turck Product Brochure entitled "Fieldbus Systems Sensoplex®2, Sensoplex®2 Ex", 37 pages (2007).
Official Search Report and Written Opinion in counterpart foreign Application No. PCT/US2009/006063, filed Nov. 12, 2009.

* cited by examiner

*Primary Examiner*—Hung T. Nguyen
(74) *Attorney, Agent, or Firm*—Kinney & Lange, P.A.

(57) ABSTRACT

An electrical connector apparatus for use with a field device includes a housing having a first end and a second end, an electrical feedthrough subassembly, and a visual indicator viewable from outside the housing. The first end of the housing is configured to mechanically connect to the field device. The electrical feedthrough subassembly extends through at least a portion of the housing and includes a plurality of electrical conductors configured to provide a removable electrical connection at the second end of the housing and a flameproof barrier disposed between the first and second ends of the housing. The visual indicator has a plurality of illumination modes indicative of a power state of the electrical feedthrough subassembly.

21 Claims, 3 Drawing Sheets

UNIVERSAL PROCESS TRANSMITTER CONNECTOR

BACKGROUND

The present invention relates to electrical connectors for use with field devices used at industrial process facilities.

Industrial process facilities utilize field devices (i.e., industrial process transmitters) to measure, actuate and otherwise control and monitor industrial processes. Examples of field devices include process sensors (for sensing temperature, pressure, flow, etc.), process actuators, process control modules, process alarm modules, process diagnostic modules, etc. In a typical industrial process facility, there will be a relatively large number of field devices deployed at a variety of locations, as desired for particular applications, and each field device can communicate with a distributed control system (DCS) that controls field device operation. Field devices typically have a housing that is specially designed to protect sensitive internal circuitry from the sometimes harsh environments in the industrial process facility, where risks of fires and explosions must be contemplated and equipment appropriately protected.

The installation and maintenance of field devices in an industrial process facility can be demanding. Many existing field devices do not include displays (e.g., an LCD) like some newer devices, nor do many existing field devices have integral terminal blocks that provide transient protection. The lack of displays or other visual indicators can make it burdensome for facility maintenance personnel to check to see that each and every field device is installed and functioning properly, such as to make sure each field device is powered. Even where a number of field devices are collected in one area of the industrial process facility, it can still be burdensome to check those devices manually without the aid of visual indicators. For instance, safety regulations can limit the ability for workers to open enclosures that are powered, so an indication regarding the power state of field devices can help workers know when enclosures can be opened.

SUMMARY

An electrical connector apparatus for use with a field device includes a housing having a first end and a second end, an electrical feedthrough subassembly, and a visual indicator viewable from outside the housing. The first end of the housing is configured to mechanically connect to the field device. The electrical feedthrough subassembly extends through at least a portion of the housing and includes a plurality of electrical conductors configured to provide a removable electrical connection at the second end of the housing and a flameproof barrier disposed between the first and second ends of the housing. The visual indicator has a plurality of illumination modes indicative of a power state of the electrical feedthrough subassembly.

DETAILED DESCRIPTION

In general, the present invention provides a universal process transmitter (UPT) connector for providing power via an electrical feedthrough to a field device for use in an industrial process facility. The UPT connector simultaneously provides a number of benefits in a single, relatively compact package. The UPT connector includes visual indicators that can indicate whether power is being supplied to the field device. The visual indicators can include light-emitting diodes (LEDs) spaced around about the UPT connector that illuminate when power is provided. The UPT connector also includes transient protection circuitry for protecting sensitive internal circuits of a connected field device from surges and other transient events. Furthermore, the UPT connector provides a flameproof and explosionproof barrier (or seal), to prevent flames and pressurization from exiting the field device through the UPT connector, or vice-versa. The UPT connector can be configured to provide quick-connect capability, such as eurofast® or minifast® connection compatibility, and can be housed in a substantially cylindrical connector housing.

Figure 1:
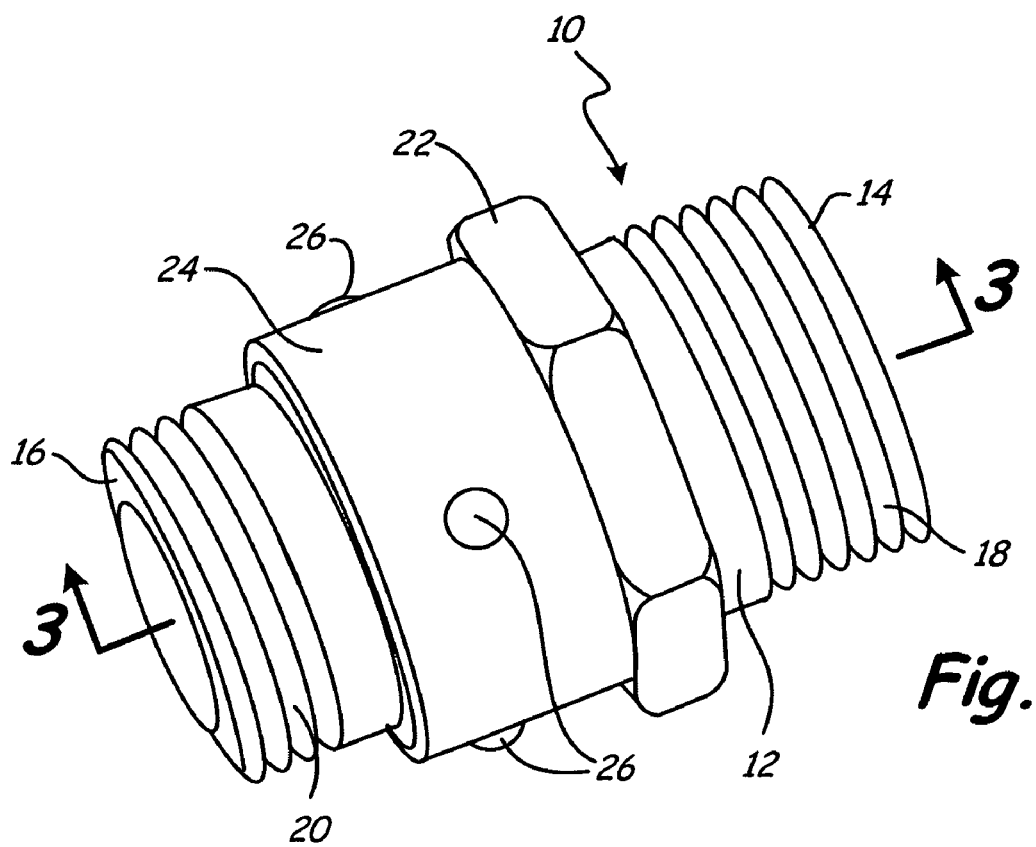
FIG. 1 is a perspective view of a universal process transmitter connector according to the present invention.

FIG. 1 is a perspective view of a UPT connector 10 having a housing 12 that defines opposite first and second ends 14 and 16, respectively. In the illustrated embodiment, the housing 12 is substantially cylindrical in shape and has external threads 18 and 20 at the respective first and second ends 14 and 16. A plurality of planar surfaces 22 are provided on the housing 12 in between the first and second ends 14 and 16 to enable a tool (e.g., a general-purpose wrench) to grip and torque the UPT connector 10. In the illustrated embodiment, there are six planar surfaces 22 configured like a hex nut. The housing 12 can be made of a metallic material.

A central portion 24 of the housing 12 is located between the first and second ends 14 and 16. More particularly, in the illustrated embodiment, the central portion 24 is located between the plurality of planar faces 22 and the second end 16 of the housing 12. The central portion 24 can have a slightly larger diameter than the first and second ends 14 and 16, which can both have approximately the same diameter (e.g., approximately 1.27 cm or 0.5 inch).

Visual indicators 26 are positioned along the central portion 24 of the housing 12, and are viewable from outside the housing 12. In the illustrated embodiment, the visual indicators 26 include three LEDs that can be illuminated to indicate the status of a parameter associated with the UPT connector 10, for example, to illuminate to indicate that power is currently provided through the UPT connector 10. The LEDs can be any color, though a green color may be desirable for applications where illumination of the visual indicators 26 designates a desirable, normal, "on" or similar operational condition of the UPT connector 10. Greater or fewer visual indicators 26 can be provided in alternative embodiments, as desired for particular applications. The visual indicators 26 can be circumferentially spaced around the housing 12, for instance, the three visual indicators 26 can be circumferentially spaced approximately 120° apart from each other. Operation of the visual indicators 26 is explained further below.

Figure 2:
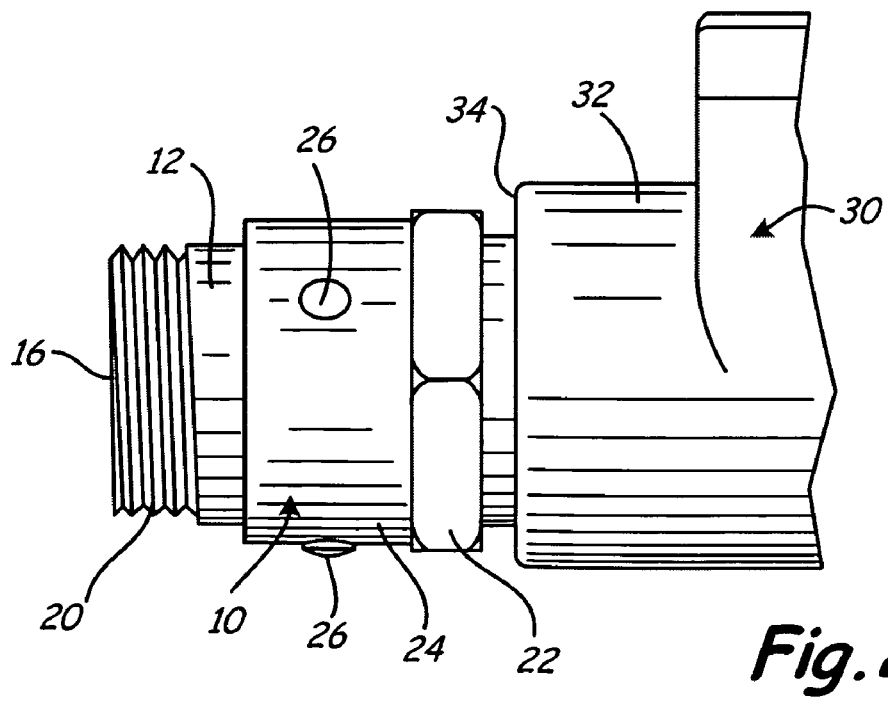
FIG. 2 is a side view of the universal process transmitter connector engaged with a field device.

FIG. 2 is a side view of the UPT connector 10 engaged with an exemplary field device 30, which can be a process sensor (for sensing temperature, pressure, flow, etc.), process actuator, process control module, process alarm module, process diagnostic module, process signal wireless relay transmitter, etc. The field device 30 includes a housing 32 that defines a connection structure 34. In the illustrated embodiment, the connection structure is an internally threaded cylindrical portion of the housing 32. The first end 14 of the housing 12 of the UPT connector 10 is threadably engaged to the connection structure 34 of the field device 30, through in FIG. 2 the first end 14 of the housing 12 is not visible. The second end 16 of the housing 12 of the UPT connector 10 can be connected to another structure in a similar manner.

Circuitry for operation of the field device 30 is located and protected within the housing 32, which is often made of a metallic material and configured to provide suitable protections against fire, explosion, etc. in a variety of industrial process facility locations. As explained further below, the UPT connector 10 can provide a connection between the field device 30 and a suitable power supply (not shown) in order to power the internal circuitry of the field device 30.

Figure 3:
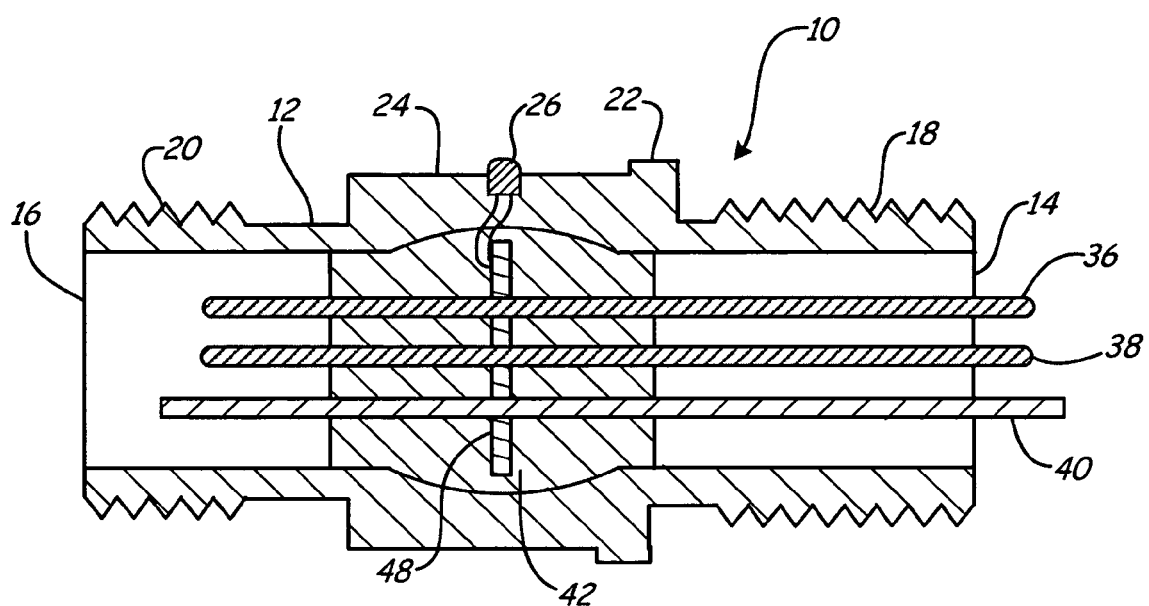
FIG. 3 is a cross-sectional view of the universal process transmitter connector taken along line 3-3 of FIG. 1.

FIG. 3 is a cross-sectional view of the UPT connector 10 taken along line 3-3 of FIG. 1. As shown in embodiment illustrated in FIG. 3, three wires 36, 38 and 40 extend through the housing 12 between its first and second ends 14 and 16. In a conventional configuration, two wires 36 and 38 provide power and the third wire 40 provides a connection to ground. The UPT connector 10 can be configured to be compatible with commercially available quick-connect structures for ease of connection and disconnection. For instance, the UPT connector 10 can be configured to provide compatibility with Turck Interlink BT eurofast® or minifast® connections or Rosemount ½ inch NPT or M20 connections. The use of quick-connect structures is desirable for speedy installation and disassembly, as well as for reducing the need for tools.

A barrier 42 is provided within the UPT connector 10 located between the opposite first and second ends 14 and 16 of the housing 12. The barrier 42 provides a flameproof and explosionproof seal within the UPT connector 10, thereby preventing flames, pressurized gas, etc. from passing out of the field device 30 through the UPT connector 10, or vice-versa. Commercial techniques such a brazing or glass-to-metal sealing can be used to form the barrier 42 to meet suitable flameproof and explosionproof rating requirements.

The three wires 36, 38 and 40 are electrically connected to a circuit board 48 potted within the housing 12. The circuit board 48 is electrically wired to the visual indicators 26 (only one is visible in FIG. 3).

Figure 4:
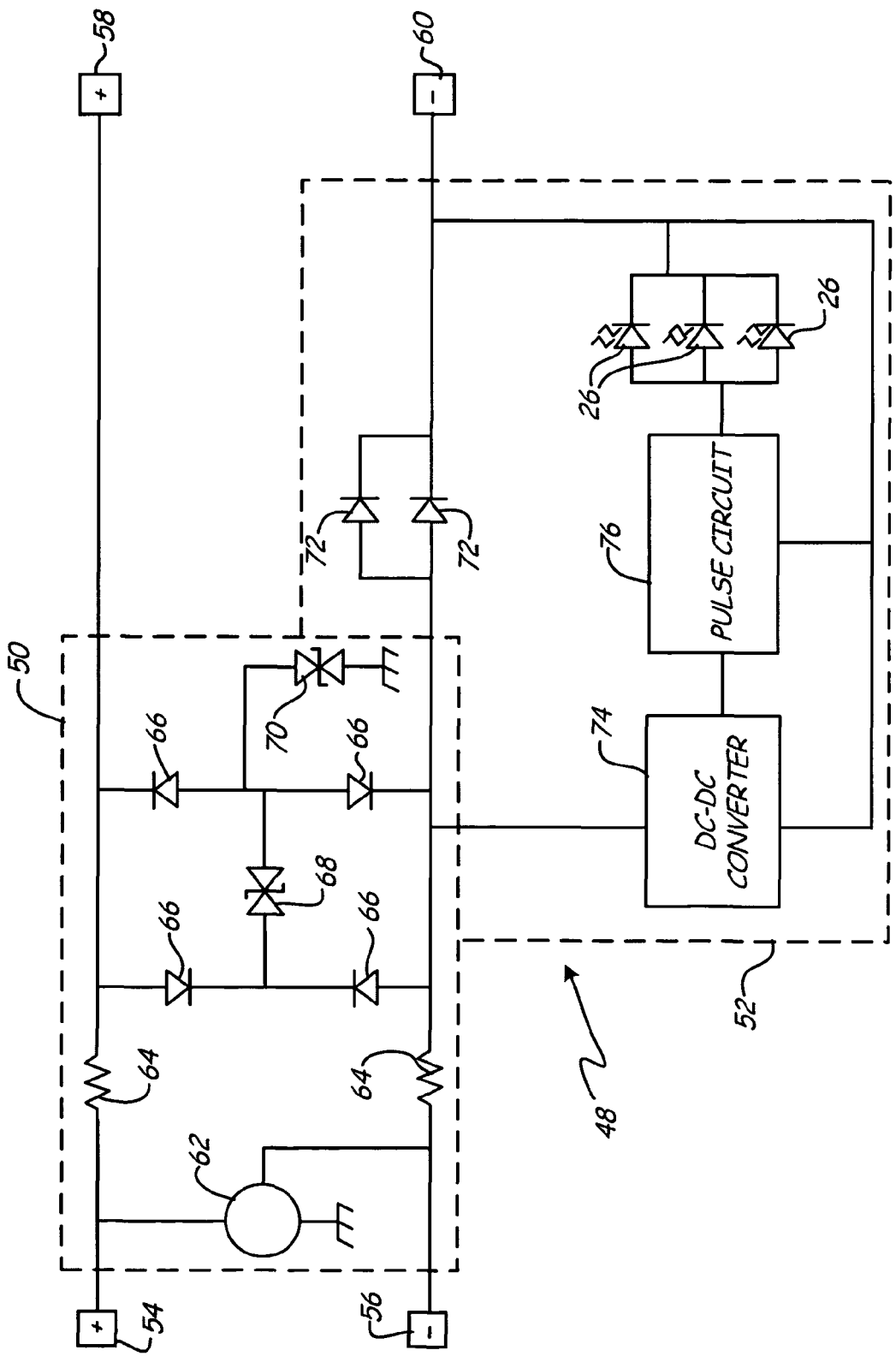
FIG. 4 is a schematic illustration of electrical feedthrough circuitry of the universal process transmitter connector.

FIG. 4 is a schematic illustration of electrical feedthrough circuitry of the UPT connector 10. The circuitry of the UPT connector 10 includes the circuit board 48 having a transient protection circuit 50 for providing protection against line surges and other transient events, a visual indicator circuit 52 for providing a visual indication that the UPT connector 10 is powered, positive and negative terminals 54 and 56, respectively, for electrical connection to a DC power source, and positive and negative terminals 58 and 60, respectively, for electrical connection to a field device.

The transient protection circuit 50 functions in a conventional manner and includes a lightning tube connected to ground, a pair of resistors 64 for limiting charge to diodes in the circuit, low-capacitance diodes 66 to rectify a charge, a first transient absorber 68 (e.g., a Transorb® assembly of mutually opposed Zener diodes, available from Vishay Americas, Shelton, Conn.), and a second transient absorber 70 connected to ground. The configuration and operation of the transient protection circuit 50 is similar to known transient protection circuits. By providing the transient protection circuit 50 within the UPT connector 10, the need for a separate, external transient protector is eliminated, which can save space and installation time.

The visual indicator circuit 52 includes redundant diodes 72 connected in parallel, a DC-DC converter 74, a pulse circuit 76, and a plurality of LEDs 78. The diodes 72 drop voltage across a loop of the visual indicator circuit 52 for powering the LEDs 78. The diodes 72 are provided redundantly to enable the LEDs 78 to remain illuminated even if there is a failure of one diode 72. The DC-DC converter 74 can have a known configuration, and in one embodiment can have a 0.7 VDC input and a 1.8 VDC output. The pulse circuit 76 provides a duty cycle for supplying current to the LEDs 78 intermittently, which can allow power savings while still giving the appearance that the LEDs 78 are continuously illuminated to the naked eye. The pulse circuit 76 can have a well-known configuration. In the illustrated embodiment, three LEDs 78 are provided in parallel, such that all three LEDs 78 are illuminated together whenever power is provided through the UPT connector circuit. Because the LEDs 78 draw power from the supply that also is delivered to power the field device, the LEDs 78 cease to be illuminated when there is a lack of power through the UPT connector 10 to the field device. This provides "on" and "off" visual indications of the power state of the electrical feedthrough circuitry.

Although the present invention has been described with reference to preferred embodiments, workers skilled in the art will recognize that changes may be made in form and detail without departing from the spirit and scope of the invention. For example, the particular size of the UPT connector can vary for compatibility with nearly any type component, cable, etc.

The invention claimed is:

1. An electrical connector apparatus for use with a field device, the apparatus comprising:
    a housing having a first end and a second end, wherein the first end is configured to mechanically connect to the field device;
    an electrical feedthrough subassembly extending through at least a portion of the housing, wherein the electrical feedthrough subassembly comprises:
        a plurality of electrical conductors configured to provide a removable electrical connection at the second end of the housing; and
        a flameproof barrier disposed between the first and second ends of the housing; and
    a visual indicator viewable from outside the housing, wherein the visual indicator has a plurality of illumination modes indicative of a power state of the electrical feedthrough subassembly.

2. The apparatus of claim 1, wherein the electrical feedthrough subassembly further comprises:
    transient protection circuitry operatively connected to the plurality of electrical conductors.

3. The apparatus of claim 2, wherein the transient protection circuitry includes a plurality of redundant diodes electrically connected to the visual indicator.

4. The apparatus of claim 1, wherein the flameproof barrier is further explosionproof.

5. The apparatus of claim 1, wherein the housing is substantially cylindrically-shaped.

6. The apparatus of claim 5, wherein the housing includes a plurality of planar faces for engagement with a tool for torquing the housing.

7. The apparatus of claim 1, wherein the first end of the housing is threaded.

8. The apparatus of claim 1, wherein the visual indicator comprises a light emitting diode that illuminates in different colors to provide the plurality of illumination modes.

9. The apparatus of claim 1, wherein the visual indicator is connected to a pulse circuit.

10. An electrical connector apparatus for use with a field device, the apparatus comprising:

a housing having a first end and a second end, wherein the first end is configured to be secured to the field device with a threaded connection;

an electrical feedthrough subassembly extending through at least a portion of the housing, wherein the electrical feedthrough subassembly comprises:

a plurality of electrical conductors configured to provide a removable electrical connection at the second end of the housing; and a flameproof barrier located in the housing;

transient protection circuitry operatively connected to the plurality of electrical conductors; and a visual indicator viewable from outside the housing, wherein the visual indicator has a plurality of illumination modes indicative of a power state of the electrical feedthrough subassembly.

11. The apparatus of claim 10, wherein the flameproof barrier is further explosionproof.

12. The apparatus of claim 10, wherein the housing is substantially cylindrically-shaped.

13. The apparatus of claim 10, wherein the visual indicator comprises a light emitting diode.

14. The apparatus of claim 10, wherein the visual indicator is connected to a pulse circuit.

15. The apparatus of claim 10, wherein the transient protection circuitry includes a plurality of redundant diodes electrically connected to the visual indicator.

16. An industrial process control apparatus comprising:

a field device housing having a threaded opening;

field device circuitry located within the field device housing;

a connector housing having a first end and a second end, wherein the first end is connected to the threaded opening of the field device housing;

an electrical feedthrough subassembly extending through at least a portion of the connector housing, wherein the electrical feedthrough subassembly comprises:

a plurality of electrical conductors electrically connected to the field device circuitry and configured to provide a removable electrical connection at the second end of the connection housing; and a flameproof barrier located in the connector housing;

transient protection circuitry operatively connected to the plurality of electrical conductors; and a visual indicator viewable from outside the connector housing, wherein the visual indicator is illuminated as a function of power supplied to the field device circuitry through of the electrical feedthrough subassembly.

17. The apparatus of claim 16, wherein the flameproof barrier is further explosionproof.

18. The apparatus of claim 16, wherein the housing is substantially cylindrically-shaped.

19. The apparatus of claim 16, wherein the visual indicator is connected to a pulse circuit.

20. The apparatus of claim 16 wherein the electrical feedthrough subassembly and the second end of the connector housing is configured to provide a eurofast® compatible connection.

21. The apparatus of claim 16 wherein the electrical feedthrough subassembly and the second end of the connector housing is configured to provide a minifast® compatible connection.

* * * * *